(12) United States Patent
Kim

(10) Patent No.: US 12,467,143 B2
(45) Date of Patent: Nov. 11, 2025

(54) SUBSTRATE PROCESSING DEVICE

(71) Applicant: ASM IP Holding B.V., Almere (NL)

(72) Inventor: SungBae Kim, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 946 days.

(21) Appl. No.: 17/670,127

(22) Filed: Feb. 11, 2022

(65) Prior Publication Data

US 2022/0259740 A1    Aug. 18, 2022

Related U.S. Application Data

(60) Provisional application No. 63/150,040, filed on Feb. 16, 2021.

(51) Int. Cl.
| | |
|---|---|
| C23C 16/52 | (2006.01) |
| C23C 16/44 | (2006.01) |
| C23C 16/455 | (2006.01) |
| F16K 27/00 | (2006.01) |
| F16K 31/126 | (2006.01) |
| F16K 37/00 | (2006.01) |
| F17D 1/04 | (2006.01) |
| F17D 3/01 | (2006.01) |
| H01L 21/67 | (2006.01) |

(52) U.S. Cl.
CPC .......... *C23C 16/52* (2013.01); *C23C 16/4412* (2013.01); *C23C 16/455* (2013.01); *C23C 16/45544* (2013.01); *C23C 16/45561* (2013.01); *F16K 27/003* (2013.01); *F16K 31/126* (2013.01); *F16K 37/0058* (2013.01); *F17D 1/04* (2013.01); *F17D 3/01* (2013.01); *H01L 21/67017* (2013.01); *H01L 21/67253* (2013.01)

(58) Field of Classification Search
CPC ... C23C 16/52; C23C 16/4412; C23C 16/455; C23C 16/45544; C23C 16/45561; F16K 27/003; F16K 31/126; F16K 37/0058; F17D 1/04; F17D 3/01; H01L 21/67017; H01L 21/67253
See application file for complete search history.

(56) References Cited

U.S. PATENT DOCUMENTS

| | | | |
|---|---|---|---|
| 5,326,975 A | 7/1994 | Barna | |
| 5,992,463 A | 11/1999 | Redemann | |
| 6,293,310 B1 | 9/2001 | Redemann | |
| 6,333,272 B1 * | 12/2001 | McMillin | H01L 21/67069 |
| | | | 438/935 |

(Continued)

FOREIGN PATENT DOCUMENTS

| | | | | |
|---|---|---|---|---|
| CN | 102654241 A | * | 9/2012 | ....... C23C 16/45557 |
| KR | 20060072058 A | * | 6/2006 | |

(Continued)

OTHER PUBLICATIONS

CN-102654241-A, English Translation (Year: 2012).*

(Continued)

*Primary Examiner* — Ryan D Walsh
(74) *Attorney, Agent, or Firm* — Snell & Wilmer L.L.P.

(57) ABSTRACT

A substrate processing device capable of detecting a gas leakage includes at least one reactor; a gas supply unit configured to supply a gas to the reactor; and a detection unit connected to the gas supply unit, wherein the detection unit is configured to detect a gas flow in the gas supply unit.

16 Claims, 15 Drawing Sheets

(56) References Cited

U.S. PATENT DOCUMENTS

| | | |
|---|---|---|
| 6,634,177 B2 | 10/2003 | Lin |
| 7,590,498 B1 | 9/2009 | Chung |
| 8,561,627 B1 * | 10/2013 | Kelekar ............ H01L 21/67017 |
| | | 137/12 |
| 8,757,197 B2 | 6/2014 | Hirata |
| 10,408,763 B2 | 9/2019 | Gamache |
| 10,533,916 B2 | 1/2020 | Sawachi |
| 2006/0060253 A1 | 3/2006 | Yoshida |
| 2011/0265895 A1 * | 11/2011 | Okabe ................. G05D 7/0617 |
| | | 137/561 A |
| 2015/0140694 A1 | 5/2015 | Inoue et al. |
| 2015/0143876 A1 | 5/2015 | Dohi |
| 2017/0236735 A1 * | 8/2017 | Leeser .................... C23C 16/52 |
| | | 137/12 |
| 2018/0057937 A1 * | 3/2018 | Lee .................. C23C 16/45561 |
| 2020/0385867 A1 * | 12/2020 | Kim ................... C23C 16/4401 |

FOREIGN PATENT DOCUMENTS

| | | | |
|---|---|---|---|
| KR | 20150071123 A | * | 6/2013 |
| KR | 101271123 B1 | * | 6/2015 |
| KR | 101868316 B1 | * | 6/2018 |

OTHER PUBLICATIONS

KR-101271123-B1, English Translation (Year: 2015).*
KR-101868316-B1, English Translation (Year: 2018).*
KR-20060072058-A, English Translation (Year: 2006).*
KR-20150071123-A, English Translation (Year: 2013).*

* cited by examiner

SUBSTRATE PROCESSING DEVICE

CROSS-REFERENCE TO RELATED APPLICATIONS

This application claims the benefit of and priority to U.S. Provisional Patent Application Ser. No. 63/150,040 filed Feb. 16, 2021, the disclosure of which is hereby incorporated by reference in its entirety.

BACKGROUND

1. Field

One or more embodiments relate to a substrate processing device, and more particularly, to a substrate processing device capable of detecting a gas leakage in a gas supply unit.

2. Description of the Related Art

A semiconductor substrate processing device includes a substrate processing unit that processes a substrate, a raw material supply unit that supplies a raw material to the substrate processing unit, and an exhaust unit that exhausts the raw material remaining in the processing unit after the raw material reacts with the substrate in the substrate processing unit. One side of the substrate processing unit is in communication with the raw material supply unit, and another side of the substrate processing unit is in communication with the exhaust unit. In more detail, the substrate processing unit may be a reactor on which a substrate is mounted. The raw material supply unit may be a gas supply unit. For substrate processing, a raw material is supplied to the substrate processing unit through the raw material supply unit. The raw material supply unit includes multiple control devices capable of controlling the flow of raw materials for smooth substrate processing, such as valves, mass flow controllers (MFCs), mass flow meters (MFMs), etc., and a gas flow path in the form of a pipe or block that serves as a flow path for gas. However, when raw materials are not properly supplied due to defects or malfunctions of various devices constituting the raw material supply unit or an inner leak in which different raw materials are mixed in the gas flow path occurs, a process failure may be generated.

SUMMARY

One or more embodiments include a device and a method capable of detecting and monitoring an inner leak in a raw material supply unit.

Additional aspects will be set forth in part in the description which follows and, in part, will be apparent from the description, or may be learned by practice of the presented embodiments of the disclosure.

According to one or more embodiments, a substrate processing device includes at least one reactor; a gas supply unit configured to supply a gas to the reactor; and a detection unit connected to the gas supply unit, wherein the detection unit may be configured to detect a gas flow in the gas supply unit.

According to an example of the substrate processing device, the gas supply unit may include a valve unit; a diaphragm connected to the valve unit; and a gas flow path configured to be opened and closed by the diaphragm.

According to another example of the substrate processing device, the detection unit may be connected to one end of the gas flow path.

According to another example of the substrate processing device, the detection unit may be mounted on the gas flow path of the gas supply unit.

According to another example of the substrate processing device, the detection unit is installed outside the gas supply unit, and the substrate processing device may further include a detection unit valve arranged between the detection unit and the gas supply unit.

According to another example of the substrate processing device, the detection unit may include an optical sensor configured to detect the gas flow.

According to another example of the substrate processing device, the detection unit may include a spectrum analysis device configured to diagnose the gas flow and gas components.

According to another example of the substrate processing device, the gas supply unit may include a gas container; an intermediate path connected to the gas container, the detection unit, and the reactor; and a gas container valve connected between the gas container and the intermediate path, wherein the substrate processing device may further include a detection unit valve connected between the detection unit and the intermediate path; and a reactor valve connected between the reactor and the intermediate path.

According to another example of the substrate processing device, the detection unit may be configured to perform a first detection operation on the gas container valve.

According to another example of the substrate processing device, the detection unit may be configured to detect the gas flow in a state in which the gas container valve is closed, the detection unit valve is opened, and the reactor valve is closed.

According to another example of the substrate processing device, the substrate processing device may further include a diversion path connected between the detection unit and the detection unit valve, and gas remaining in the intermediate path may be exhausted through the diversion path during the first detection operation of the detection unit.

According to another example of the substrate processing device, the first detection operation may be performed during a processing operation of the substrate processing device.

According to another example of the substrate processing device, the first detection operation may be performed during a pause between a first batch process and a second batch process.

According to another example of the substrate processing device, the first detection operation may be performed during a period of time until a second substrate is carried into the reactor after the process of a first substrate is completed within the same batch process.

According to another example of the substrate processing device, the gas supply unit may include a first path; a first valve connected between the first path and the gas container; a second valve configured to discharge gas from the gas container to a second path; and a third valve connected between the first path and the second path, wherein the gas container valve may be connected between the second path and the intermediate path.

According to another example of the substrate processing device, the detection unit may be configured to perform a second detection operation on the third valve.

According to another example of the substrate processing device, the detection unit may be configured to detect the gas flow in a state in which the first valve, the second valve, and the third valve are closed, the gas container valve and the detection unit valve are opened, and the reactor valve is closed.

According to one or more embodiments, a substrate processing device includes an intermediate path having a first end, a second end, and a third end in communication with each other; a valve connected to the first end; at least one reactor connected to the second end; and a detection unit connected to the third end, wherein the detection unit may be configured to detect the flow of gas in the valve or at least one valve in front of the valve.

According to one or more embodiments, a substrate processing device includes at least one reactor; a path for gas delivery to the at least one reactor; at least one gas container configured to supply a gas to the path; a plurality of valves between the at least one gas container and the path; and a detection unit configured to detect a gas flow in the path in response to a command for operating opening and closing of the plurality of valves.

According to one or more embodiments, a substrate processing device includes a gas container configured to store a first gas; a first path configured to deliver a second gas; a second path configured to deliver at least one of the first gas and the second gas; a first valve connected between the first path and the gas container; a second valve configured to discharge the first gas from the gas container to the second path; a third valve connected between the first path and the second path; a third path connected to the second path and configured to deliver the first gas and the second gas; a fourth valve connected between the second path and the third path; a fifth valve connected between the third path and a detection unit; and a sixth valve connected between the third path and a reactor, wherein the detection unit is configured to detect gas leakage in at least one of the first valve to the fourth valve.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
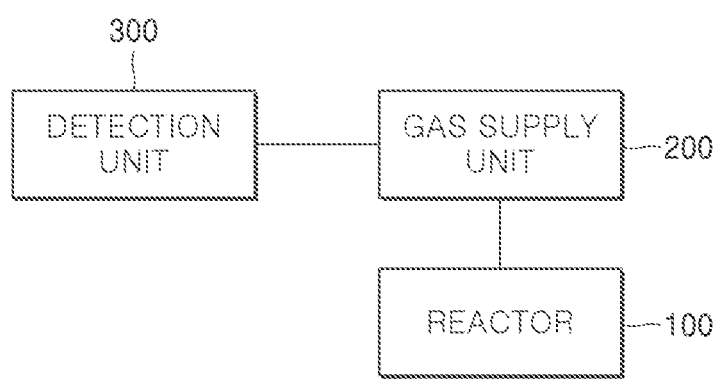
FIGS. 1 to 6 are views of a substrate processing device according to embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected as a result of, for example, manufacturing techniques and/or tolerances. Thus, the embodiments of the disclosure should not be construed as being limited to the particular shapes of regions illustrated herein but may include deviations in shapes that result, for example, from manufacturing processes.

FIGS. 1 to 6 are views of a substrate processing device according to embodiments of the inventive concept.

Referring to FIG. 1, the substrate processing device may include a reactor 100, a gas supply unit 200, and a detection unit 300.

The reactor 100 may include members that perform an appropriate function according to the function of the substrate processing device. For example, when the substrate processing device performs a deposition function, the reactor 100 may include a member such as a showerhead assembly. In another embodiment, when the substrate processing device performs a polishing function, the reactor 100 may include a polishing pad. Although only one reactor 100 is shown in the drawing, the substrate processing device may include a plurality of reactors 100.

The gas supply unit 200 may be configured to supply gas to the reactor 100. For example, the gas supply unit 200 may include a gas container storing gas and a gas flow path connected to the reactor 100. The gas flow path may also be connected to the gas container, and thus, the gas stored in the gas container of the gas supply unit may be delivered to the reactor 100 through the gas flow path.

The gas flow path of the gas supply unit 200 may be configured to be opened or closed. In an embodiment, the gas supply unit 200 may include a valve unit and a diaphragm connected to the valve unit, and the gas flow path may be configured to be opened and closed by the diaphragm. For example, the diaphragm may be moved by driving the valve unit, and the gas flow path may be opened or closed by the movement of the diaphragm.

The detection unit 300 may be configured to detect the flow of gas in the gas supply unit 200. For example, the detection unit 300 may be configured to detect gas leakage in the gas flow path of the gas supply unit 200. In an embodiment, the detection unit 300 may be configured to detect gas leakage that may occur due to a malfunction of the diaphragm in a state in which the diaphragm of the gas flow path closes the gas flow path. In another embodiment, the detection unit 300 may be configured to detect a non-flow of gas that may occur due to a malfunction of the diaphragm in a state in which the diaphragm of the gas flow path opens the gas flow path.

The detection unit 300 may be connected to the gas supply unit 200. For example, the detection unit 300 may be connected to one end of the gas flow path of the gas supply unit 200. In an example, the detection unit 300 may be installed outside the gas supply unit 200. In this case, the substrate processing device may further include a detection unit valve arranged between the detection unit 300 and the gas supply unit 200. While the substrate processing device performs a normal substrate processing process, the detection unit valve may be closed, and when the substrate processing device performs a detection operation, the detection unit valve may be opened.

In another example, the detection unit 300 may be installed inside the gas supply unit 200. For example, the detection unit 300 may be arranged inside the gas flow path of the gas supply unit 200. In more detail, the detection unit 300 may be mounted on the gas flow path.

The detection unit 300 configured to detect the flow of gas may be implemented in various ways. For example, in some embodiments, the detection unit 300 may include an optical sensor configured to detect the flow of gas. In another embodiment, the detection unit 300 may include a spectrum analysis device configured to diagnose the flow of gas and gas components.

Figure 2:
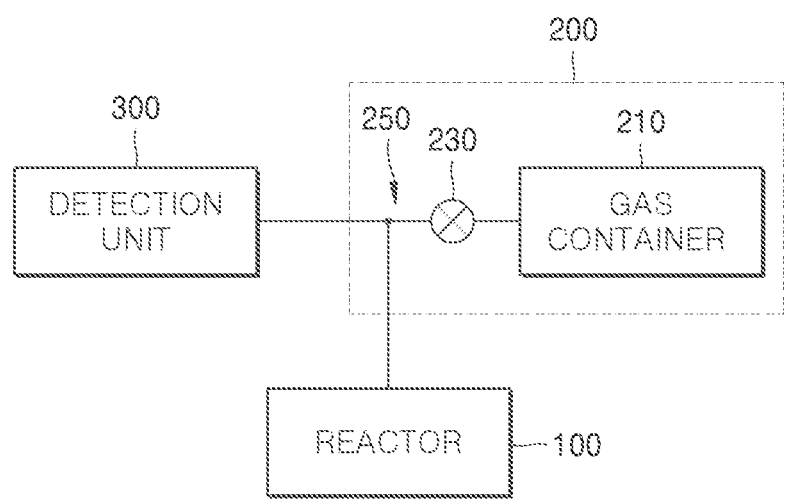

FIG. 2 is a view of a substrate processing device according to embodiments of the inventive concept. The substrate processing device according to the embodiments may be a variation of the substrate processing device according to the above-described embodiments. Hereinafter, repeated descriptions of the embodiments will not be given herein.

Referring to FIG. 2, the substrate processing device may include the at least one reactor 100, the gas supply unit 200, and the detection unit 300. The gas supply unit 200 may include a gas container 210 and at least one valve connected to the gas container 210. The at least one valve may include a valve 230. For example, gas stored in the gas container 210 may be delivered to the reactor 100 by driving the valve 230.

The detection unit 300 may be connected to communicate with a portion of an intermediate path 250 that is a gas flow path connected between the gas supply unit 200 and the reactor 100. The intermediate path 250 may be included in the gas supply unit 200. The detection unit 300 connected to the gas supply unit 200 may be connected to the gas supply unit 200 through the intermediate path 250.

In some embodiments, the intermediate path 250 may include a first end, a second end, and a third end. The first end may be connected to the valve 230. The second end may be connected to at least one reactor 100. The third end may be connected to the detection unit 300. Although not shown in the drawings, a reactor valve may be arranged between the second end and the reactor 100. Also, a detection unit valve may be arranged between the third end and the detection unit 300. A description of the reactor valve and the detection unit valve will be described later in FIG. 3.

The detection unit 300 may be configured to detect a gas flow in the valve 230 or a valve (not shown) in front of the valve 230. For example, a controller of the substrate processing device may generate a command to close the valve 230, and the valve 230 may be closed by the command. After the closing operation, the detection unit 300 may detect the flow of gas in the valve 230 and perform a detection operation to check whether the valve 230 operates properly (e.g., pressure check).

During the detection operation, when the detection unit 300 does not detect the flow of gas in the valve 230, the valve 230 is closed according to the closing operation. Accordingly, the detection unit 300 may transmit a pass signal to the controller of the substrate processing device. During the detection operation, when the detection unit 300 detects the flow of gas in the valve 230, gas leakage occurs despite the closing operation. Accordingly, the detection unit 300 may transmit a rejection signal (i.e., a signal indicating the occurrence of gas leakage) to the controller of the substrate processing device.

Figure 3:
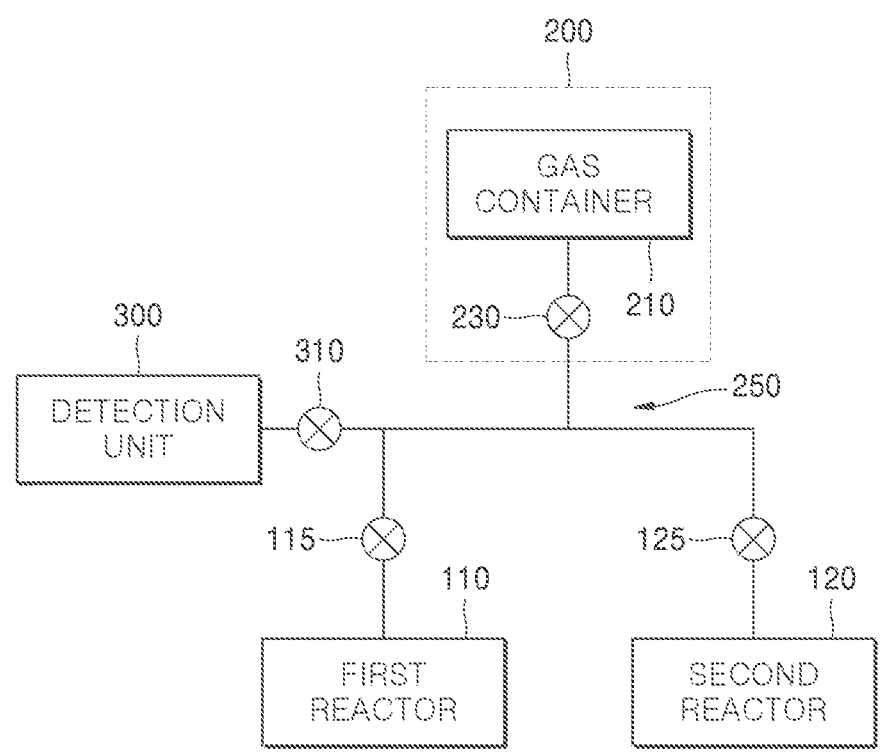

FIG. 3 is a view of a substrate processing device according to embodiments of the inventive concept. The substrate processing device according to the embodiments may be a variation of the substrate processing device according to the above-described embodiments. Hereinafter, repeated descriptions of the embodiments will not be given herein.

Referring to FIG. 3, the substrate processing device may include a plurality of reactors, for example, a first reactor 110 and a second reactor 120. In this case, the substrate processing device may further include reactor valves 115 and 125 respectively connected to the reactors 110 and 120. The first reactor valve 115 may be connected between the first reactor 110 and the gas supply unit 200. The second reactor valve 125 may be connected between the second reactor 120 and the gas supply unit 200.

The intermediate path 250 may be connected to the gas container 210, the detection unit 300, the first reactor 110, and the second reactor 120. The gas container valve 230 may be connected between the gas container 210 and the intermediate path 250. The intermediate path 250 and the gas container valve 230 may be included in the gas supply unit 200. A detection unit valve 310 may be connected between the detection unit 300 and the intermediate path 250. The first reactor valve 115 may be connected between the first reactor 110 and the intermediate path 250. The second reactor valve 125 may be connected between the second reactor 120 and the intermediate path 250.

The detection unit 300 may be configured to perform a first detection operation for the gas container valve 230. In an example, the detection unit 300 may be configured to detect the flow of gas in a state in which the gas container valve 230 is closed, the detection unit valve 310 is opened, and the first reactor valve 115 and the second reactor valve 125 are closed. The controller of the substrate processing device may generate a first command signal for setting such a state and transmit the first command signal to each valve.

During the first detection operation, when the detection unit 300 does not detect the flow of gas in the valve, the gas container valve 230 is closed according to the first command signal. Accordingly, the detection unit 300 may transmit a pass signal to the controller of the substrate processing device. During the first detection operation, when the detection unit 300 detects the flow of gas in the valve 230, gas leakage occurs despite the first command signal to close the gas container valve 230. Accordingly, the detection unit 300 may transmit a rejection signal to the controller of the substrate processing device.

In some embodiments, the first detection operation may be performed during a processing operation of the substrate processing device. For example, when the substrate processing device is a deposition device, the first detection operation may be performed without interruption during the deposition process. This first detection operation may be performed, for example, during a pause between a first batch process and a second batch process. That is, a detection operation is performed between batch processes, so that a decrease in operating efficiency of the substrate processing device may be minimized.

In an additional embodiment, the first detection operation may be performed during the same batch process. In more detail, the first detection operation may be performed during a period of time until the second substrate is carried into the reactor 110 and/or 120 after the process of the first substrate is completed.

Although not shown in the drawings, the substrate processing device may further include a diversion path connected between the detection unit 300 and the detection unit valve 310. In this case, during the first detection operation of the detection unit 300, gas remaining in the intermediate path 250 may be exhausted through the diversion path. A description of the diversion path will be described later in FIG. 4.

Figure 4:
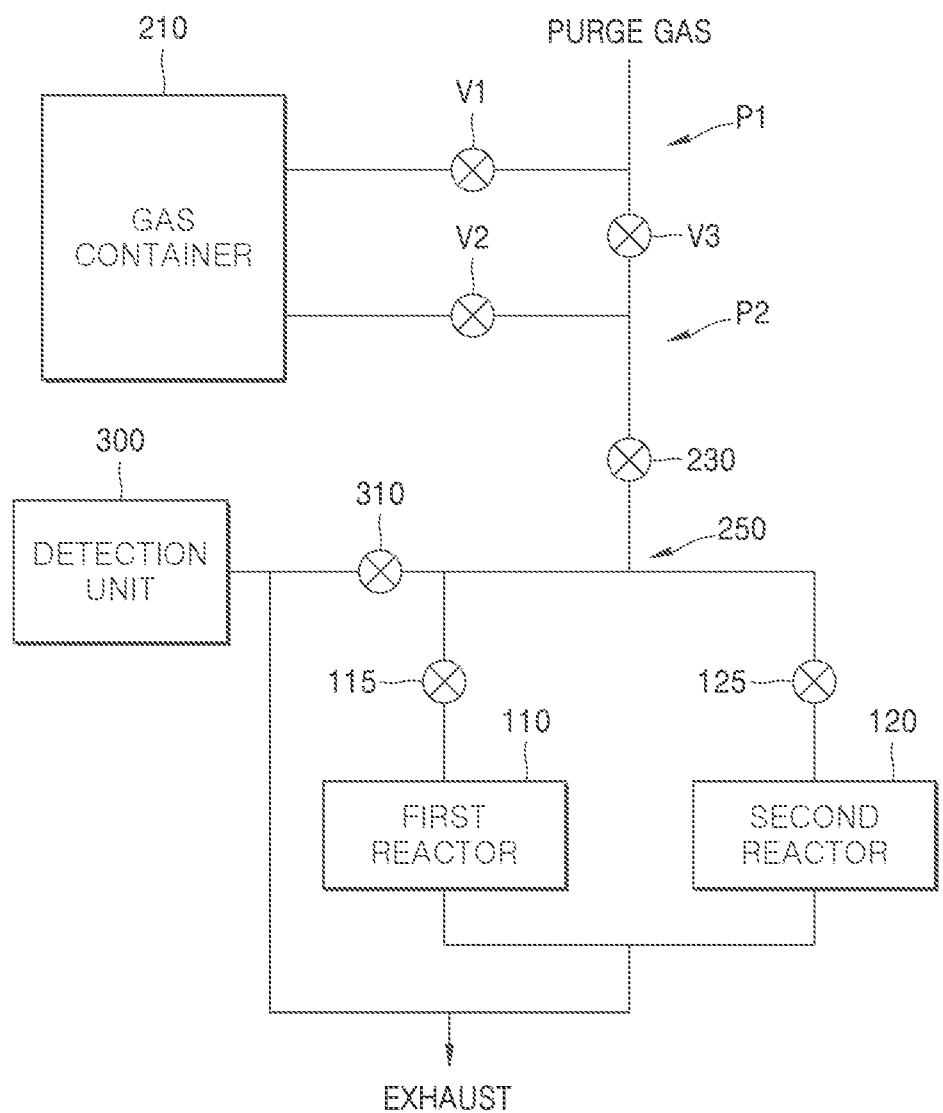

FIG. 4 is a view of a substrate processing device according to embodiments of the inventive concept. The substrate processing device according to the embodiments may be a variation of the substrate processing device according to the above-described embodiments. Hereinafter, repeated descriptions of the embodiments will not be given herein.

Referring to FIG. 4, the substrate processing device may include a first path P1, a first valve V1 connected between the first path P1 and the gas container 210, a second valve V2 configured to discharge gas from the gas container 210 to the second path P2, and a third valve V3 connected between the first path P1 and the second path P2.

The first path P1 may be configured to deliver gas from the outside. For example, a purge gas may be supplied through the first path P1. In another example, gas to be stored in the gas container 210 may be supplied through the first path P1.

The second path P2 may be connected to the first path P1 and the gas container 210. Accordingly, the second path P2 may deliver a first gas delivered from the first path P1 and/or a second gas stored in the gas container 210. The gas container valve 230 may be connected between the second path P2 and the intermediate path 250. Accordingly, the first gas and/or the second gas in the second path P2 may be delivered to the intermediate path 250 by opening and closing the gas container valve 230.

The first valve V1 may be an inlet valve used to deliver gas (e.g., a source gas) to be stored in the gas container 210 to the gas container 210. The second valve V2 is an outlet valve used to discharge the gas stored in the gas container 210 to the second path P2 and deliver the gas to the first reactor 110 and the second reactor 120. The third valve V3 may be a purge valve used to purge the gas supplied to the second path P2, the first reactor 110, and the second reactor 120.

The detection unit 300 may perform a detection operation on the gas container valve 230 and/or a valve (e.g., the third valve V3) in front of the gas container valve 230. For example, the detection unit 300 may perform a first detection operation on the gas container valve 230. Also, the detection unit 300 may perform a second detection operation on the third valve V3.

During the first detection operation, the detection unit 300 may be configured to detect the flow of gas in a state in which the first valve V1 and the second valve V2 are closed, the third valve V3 is opened, the gas container valve 230 is closed, the detection unit valve 310 is opened, and the first reactor valve 115 and the second reactor valve 125 are closed. During the first detection operation, when the detection unit 300 does not detect the flow of gas in the valve, a pass determination will be made as to whether the gas container valve 230 leaks gas. When the detection unit 300 detects the flow of gas in the valve, a rejection determination for the gas container valve 230 will be made.

During the second detection operation, the detection unit 300 may be configured to detect the flow of gas in a state in which the first valve V1, the second valve V2, and the third valve V3 are closed, the gas container valve 230 and the detection unit valve 310 are opened, and the first reactor valve 115 and the second reactor valve 125 are closed. During the second detection operation, when the detection unit 300 does not detect the flow of gas, a pass determination will be made as to whether the third valve V3 leaks gas. When the detection unit 300 detects the flow of gas, a rejection determination for the third valve 230 will be made.

Figure 5:
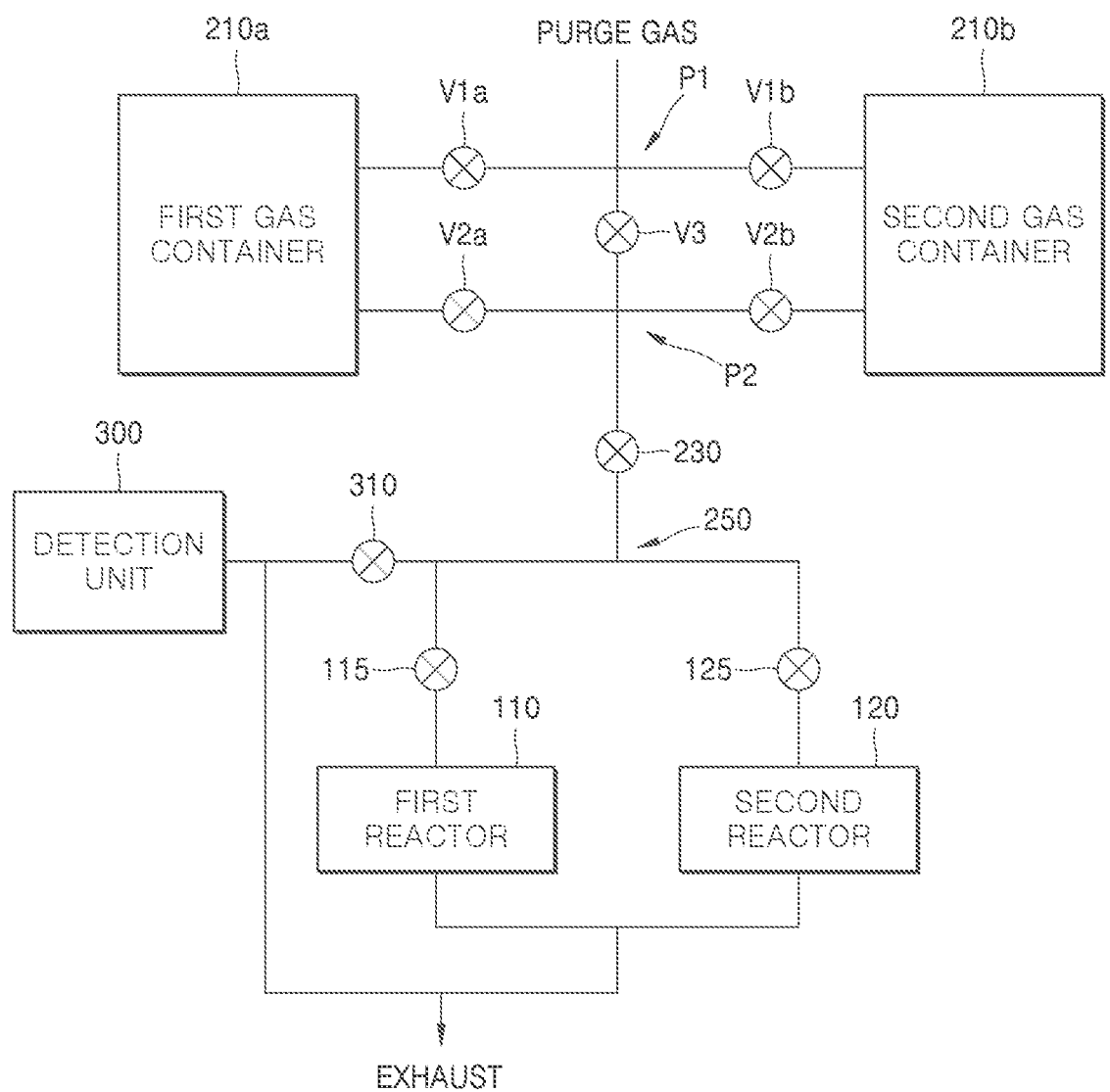

FIG. 5 is a view of a substrate processing device according to embodiments of the inventive concept. The substrate processing device according to the embodiments may be a variation of the substrate processing device according to the above-described embodiments. Hereinafter, repeated descriptions of the embodiments will not be given herein.

Referring to FIG. 5, the substrate processing device may include a first gas container 210a and a second gas container 210b. Similar to an inlet valve V1a for inflow of gas into the first gas container 210a and an outlet valve V2a for outflow of gas from the first gas container 210a, the substrate processing device may further include an inlet valve V1b for inflow of gas into the second gas container 210b and an outlet valve V2b for outflow of gas from the second gas container 210b.

The substrate processing device of FIG. 5 is the same as the substrate processing device of FIG. 4 except that an another gas container is added. That is, the substrate processing device may include the following components.

The first gas container 210a configured to store a first gas (e.g., a source gas)
The first path P1 configured to deliver a second gas (e.g., a purge gas)

The second gas container 210*b* configured to store a third gas (e.g., a reaction gas)

The first inlet valve V1*a* connected between the first path P1 and the first gas container 210*a* (hereinafter 'first valve V1*a*')

The first outlet valve V2*a* configured to discharge the first gas from the first gas container 210*a* to the second path P2 (hereinafter 'second valve V2*a*')

The second inlet valve V1*b* connected between the first path P1 and the second gas container 210*b*

The second outlet valve V2*b* configured to discharge the third gas from the second gas container 210*b* to the second path P2

The third valve V3 connected between the first path P1 and the second path P2 (e.g., a purge valve for delivery of a purge gas)

The third path 250 which is connected to the second path P2, the third path 250 being an intermediate path configured to deliver the first gas, the second gas, and the third gas A fourth valve connected between the second path P2 and the third path 250 (i.e., the gas container valve 230)

A fifth valve connected between the third path 250 and the detection unit 300 (i.e., the detection unit valve 310)

A sixth valve connected between the third path 250 and the reactors 110 and 120 (i.e., the reactor valves 115 and 125)

The detection unit 300 may be configured to detect gas leakage in at least one of the first to fourth valves V1*a*, V2*a*, V3, and 230. To this end, the substrate processing device may generate a command for operating opening and closing of the first to fourth valves V1*a*, V2*a*, V3, and 230 and the detection unit 300 may be configured to detect the flow of gas after the command. In another embodiment, the detection unit 300 may be configured to further detect a gas leakage in at least one of the valves V1*b* and V1*b*.

Figure 6:
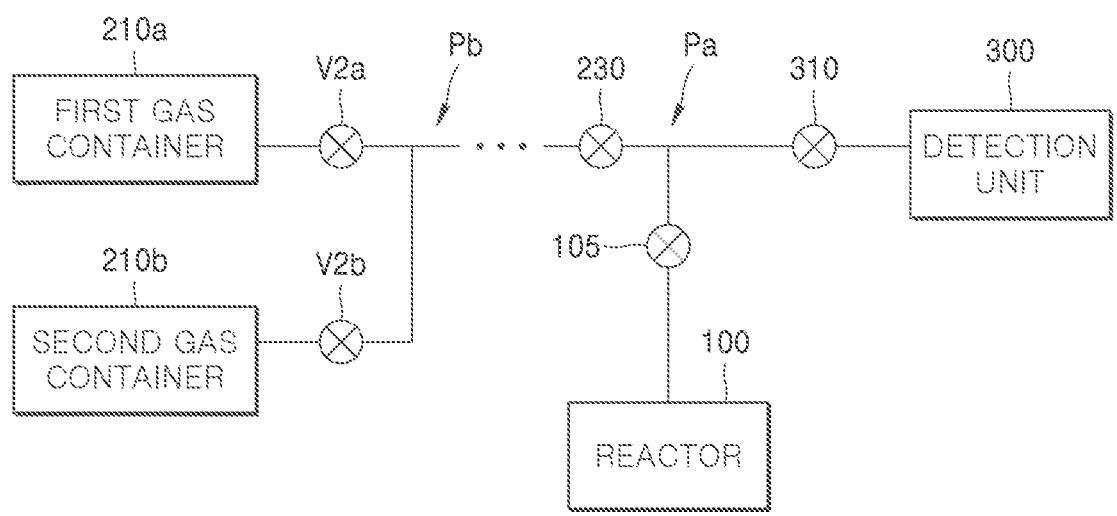

FIG. 6 is a view of a substrate processing device according to embodiments of the inventive concept. The substrate processing device according to the embodiments may be a variation of the substrate processing device according to the above-described embodiments. Hereinafter, repeated descriptions of the embodiments will not be given herein.

Referring to FIG. 6, the substrate processing device may include at least one of the gas containers 210*a* and 210*b*, at least one of paths Pa and Pb, at least one reactor 100, and the detection unit 300.

Because at least one of the gas containers 210*a* and 210*b* and the at least one reactor 100 correspond to the gas container and the reactor described above, a detailed description will not be given herein. The substrate processing device may include at least one of the outlet valves V2*a* and V2*b* corresponding to each of the at least one gas container 210*a* and 210*b*. In addition, the substrate processing device may include at least one reactor valve 105 corresponding to the at least one reactor 100.

The paths Pa and Pb may be configured to deliver gas to the at least one reactor 100. In more detail, gas supplied from at least one of the gas containers 210*a* and 210*b* may be delivered to the at least one reactor 100 through the paths Pa and Pb.

The substrate processing device may include a plurality of valves arranged between at least one of the gas containers 210*a* and 210*b* and the paths Pa and Pb. The plurality of valves may include the above-described outlet valves V2*a* and V2*b* and the gas container valve 230 connected between the outlet valves V2*a* and V2*b* and a path Pa.

The detection unit 300 may be configured to detect gas leakage that may exist in the plurality of valves arranged between at least one of the gas container 210*a* and 210*b* and the paths Pa and Pb. To this end, the detection unit 300 may be configured to detect the flow of gas in the paths Pa and Pb in response to a command for operating opening and closing of the plurality of valves (e.g., a command to open the detection unit valve 310). When the detection unit 300 does not detect the flow of gas, a pass determination will be made, and when the detection unit 300 detects the flow of gas, a rejection determination will be made.

Figure 7:
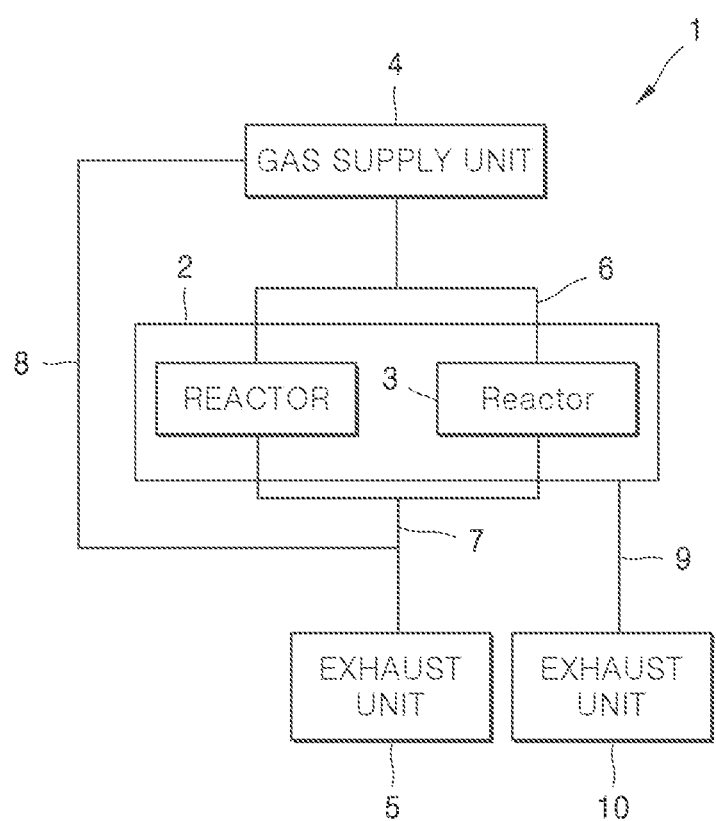
FIG. 7 is a view of a substrate processing system according to embodiments of the inventive concept.

FIG. 7 is a view of a substrate processing system according to embodiments of the inventive concept. In FIG. 7, a substrate processing device 1 includes an external chamber 2 including at least one reactor 3, and a gas supply unit 4 is connected to the reactor 3 through a gas supply path 6. The gas supply unit 4 includes devices for controlling the flow rate and flow of gas supplied to the reactor 3. For example, the gas supply unit 4 includes a mass flow controller (MFC), valves, and a gas flow path connecting such devices. The gas flow path of the gas supply unit 4 may be formed in a block type, so that a gas movement distance and a blind spot where gas may remain are minimized, and rapid gas supply and exchange are possible.

The gas supply unit 4 and the reactor 3 of FIG. 7 are connected to each other through the gas supply path 6 and gas is supplied to the reactor 3 through the gas supply path 6. The reactor 3 in the external chamber 2 may be plural, in which case the gas supply path 6 is branched to connect to each reactor. In FIG. 7, there are a plurality of exhaust units, and include a first exhaust unit 5 for exhausting gas after reaction from the reactor, and a second exhaust unit 10 for maintaining a constant pressure in the external chamber. The first exhaust unit 5 is connected to the reactor 3 through a first exhaust line 7 and the second exhaust unit 10 is connected to the external chamber 2 through a second exhaust line 9. When there are a plurality of reactors 3, the first exhaust line 7 is branched to connect to each reactor. In other words, each reactor shares the first exhaust unit 5. However, the first exhaust unit 5 is not limited thereto, and each reactor may be connected to each exhaust unit.

As described above, the second exhaust unit 10 maintains a constant pressure inside the external chamber 2. For example, by making the pressure inside the external chamber 2 higher than a process pressure inside the reactor 3, a reaction gas in one reactor is prevented from diffusing to another reactor. In addition, by maintaining the pressure inside the external chamber 2 lower than an external atmospheric pressure, it is possible to transfer a substrate from a substrate transfer chamber (not shown) to the reactor 3 through the external chamber 2 or vice versa.

In FIG. 7, the gas supply unit 4 and the first exhaust line 7 are connected to each other through a diversion path 8. That is, through the diversion path 8, the gas supply unit 4 is directly connected to the first exhaust line 7 and the first exhaust unit 5 without passing through the reactor 3. Gas not supplied from the gas supply unit 4 to the reactor 3 may be directly exhausted to the exhaust unit through the diversion path 8. For example, in the atomic layer deposition process, when one reactive gas is supplied to the reactor, the other reactive gas is exhausted through the diversion path 8. Thus, it is possible to prevent the two gases from chemically reacting with each other before one of the gases reaches the reactor.

Figure 8:
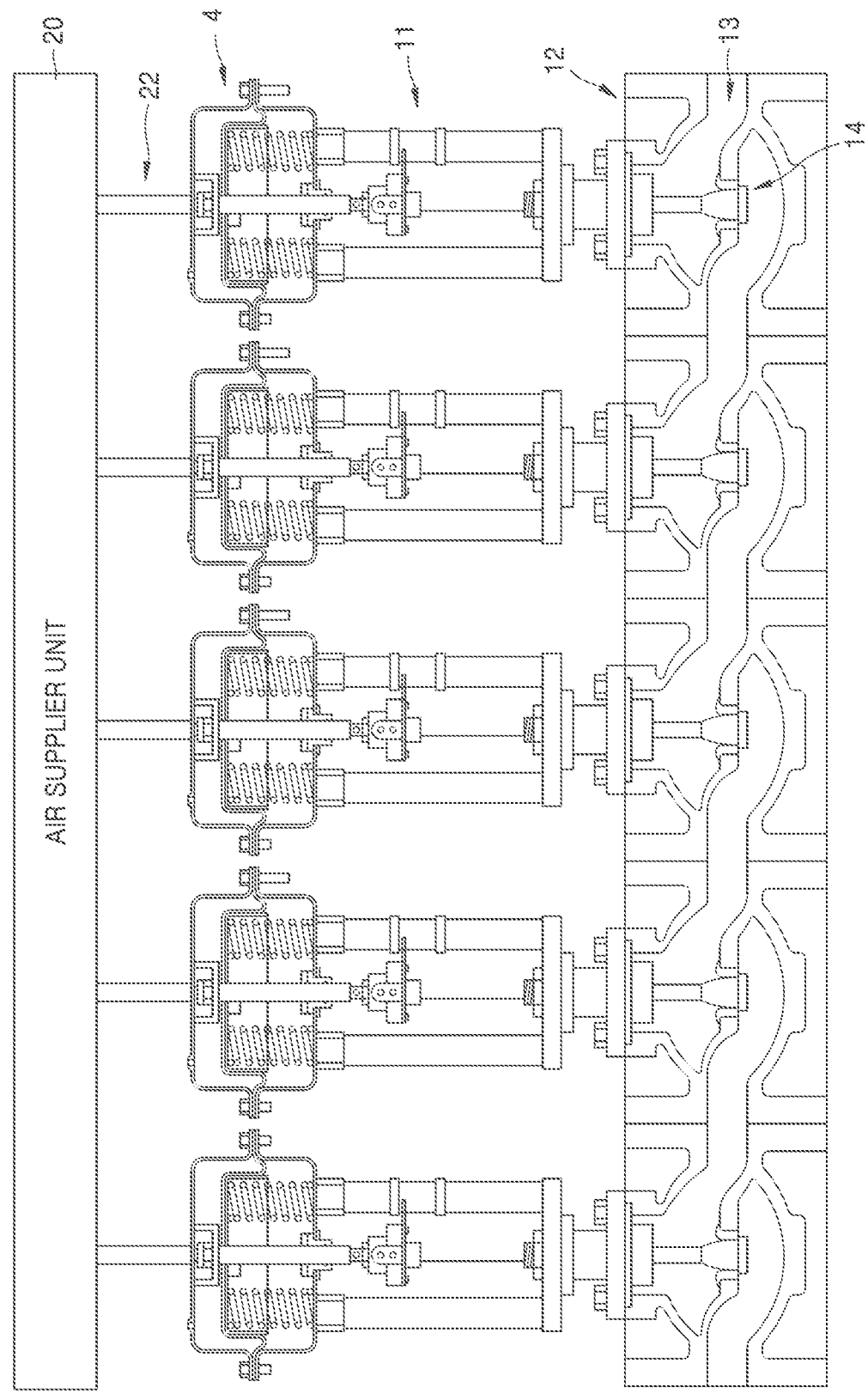
FIG. 8 is a view of an example of a cross-section of a gas supply unit and a structure of the gas supply unit.

FIG. 8 shows a cross-section of the gas supply unit 4 and a structure of the gas supply unit 4.

In FIG. 8, the gas supply unit 4 includes a valve unit 11, a block part 12, a gas flow path 13, and a diaphragm 14. The valve unit 11 is connected to the air supply unit 20 of the substrate processing device 1(FIG. 7) through the air supply path 22 and controls movement of the diaphragm 14 of the block part 12. For example, when air is supplied to the valve unit 11, the diaphragm 14 is lowered by the pressure and the gas flow path 13 in the block part 12 is opened to allow gas to flow. On the contrary, when the supply of air to the valve unit 11 is stopped, the diaphragm 14 returns to its original position, the gas flow path 13 is closed, and the flow of gas is stopped (normally closed). However, on the contrary, when the air is supplied, the diaphragm 14 is closed, and when the air supply is stopped, the diaphragm 14 may be driven to be open, operating in a normal open manner (normally opened). The diaphragm 14 is connected to the valve unit 11 and the vertical movement is controlled according to the driving of the valve unit 11.

Figure 9:
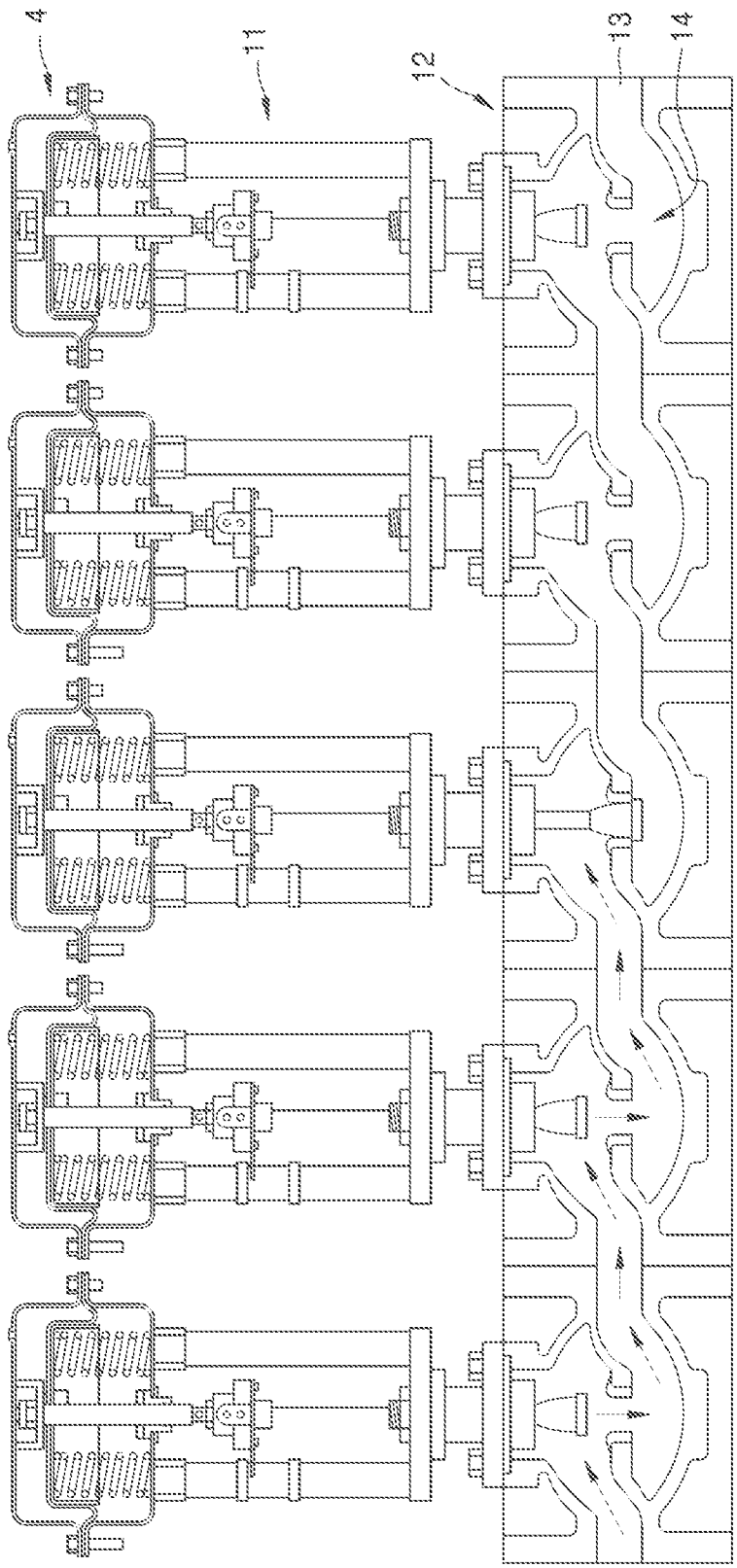
FIGS. 9 and 10 are views of examples of a gas flow and malfunction in a gas supply unit.
Figure 10:
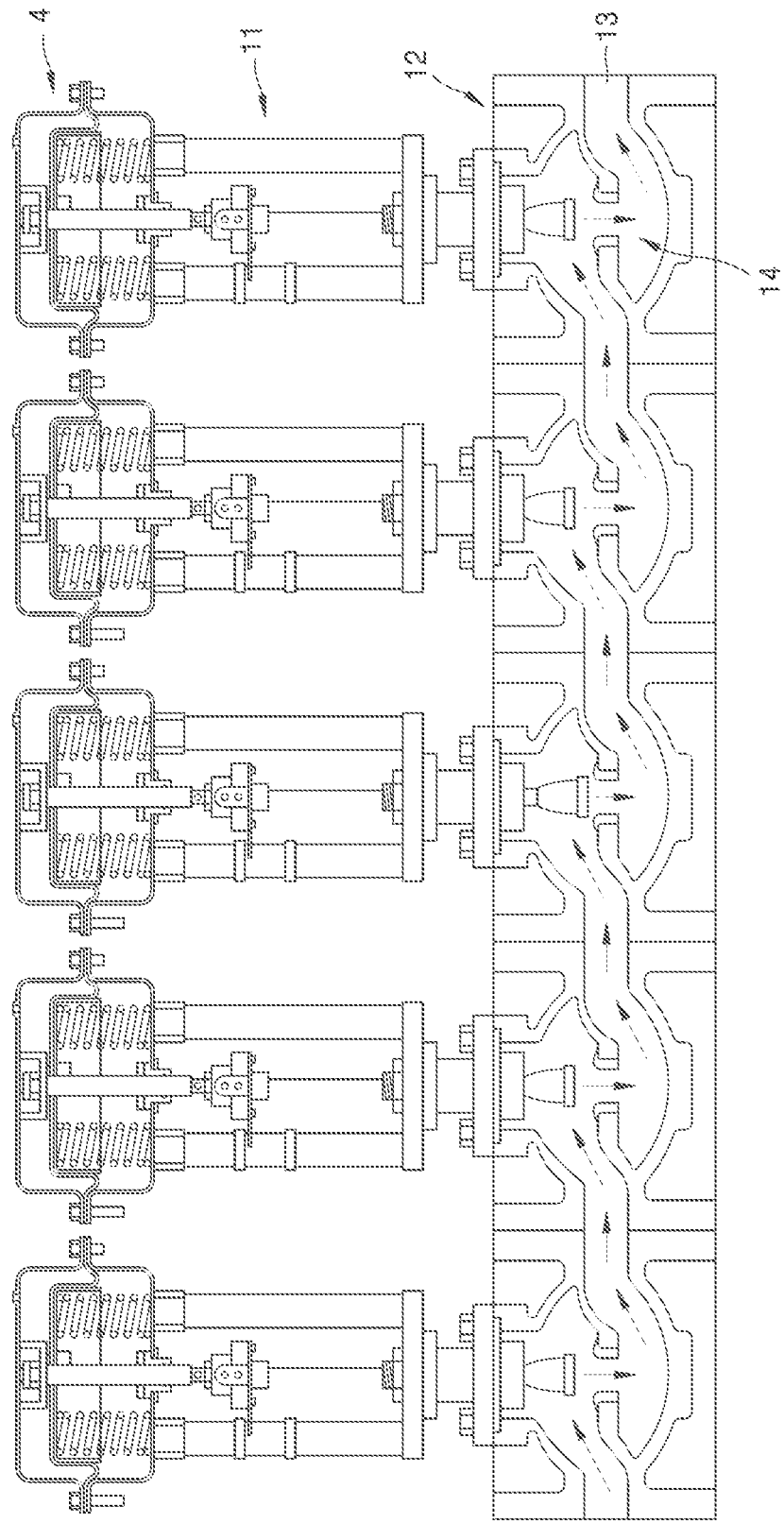

FIGS. 9 and 10 are views of examples of the flow of gas and malfunction in the gas supply unit 4.

FIG. 9 shows a state in which the air is not supplied to one valve (center valve), so that a diaphragm is closed, and the air is supplied to the other valves, so that other diaphragms are opened by the pressure. However, because the center valve is closed, it indicates that the flow of gas (arrows) is stopped. FIG. 10 shows an example (dotted arrows) in which a gas leak occurs in a gas flow path due to an abnormality in a diaphragm of a closed valve (center valve). In this case, a chemical reaction between heterogeneous gases occurs within the gas flow path or before gas is supplied to a reactor, thereby contaminating a device or preventing a normal process on a substrate. In particular, in the case of an atomic layer deposition process, the process itself is not performed and may cause a device defect.

Figure 11:
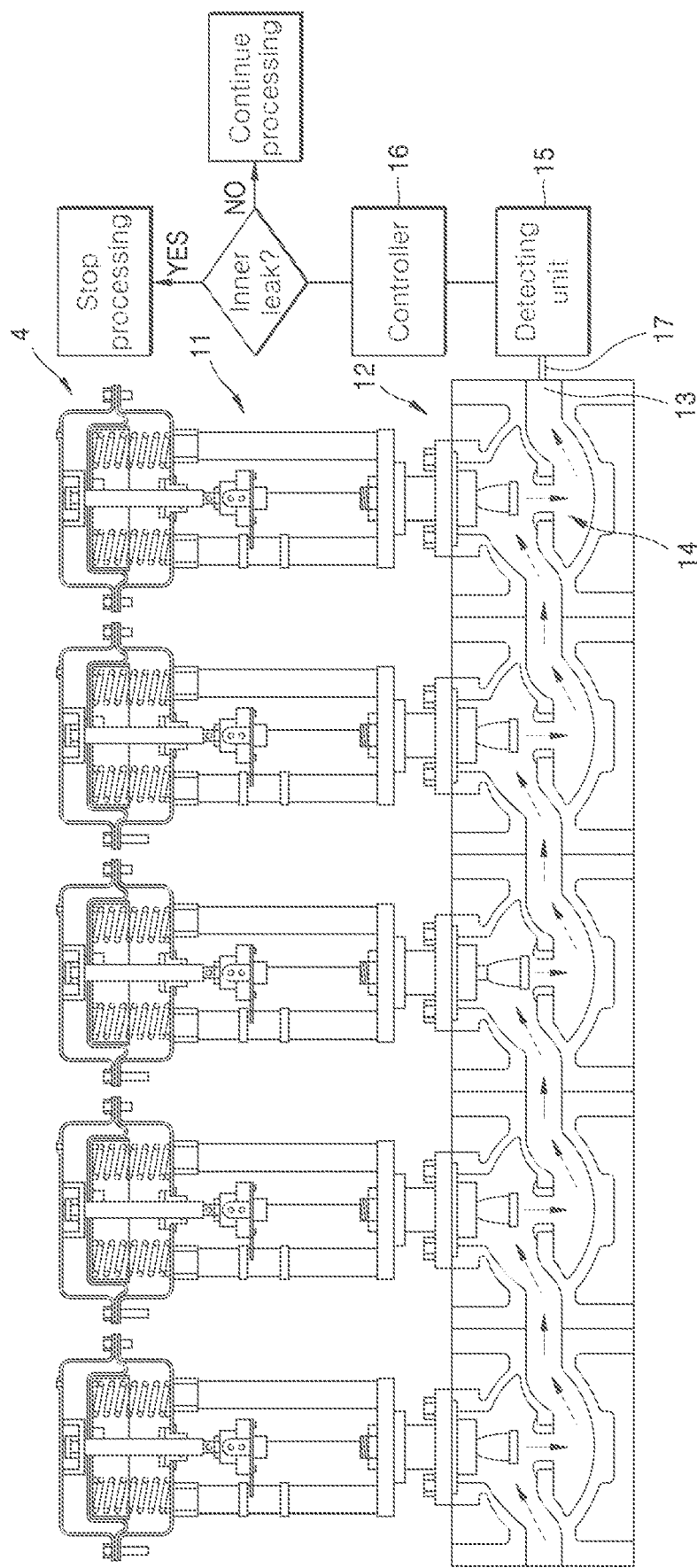
FIGS. 11 and 12 are views of a gas supply unit and a method of diagnosing an inner leak according to the disclosure.
Figure 12:
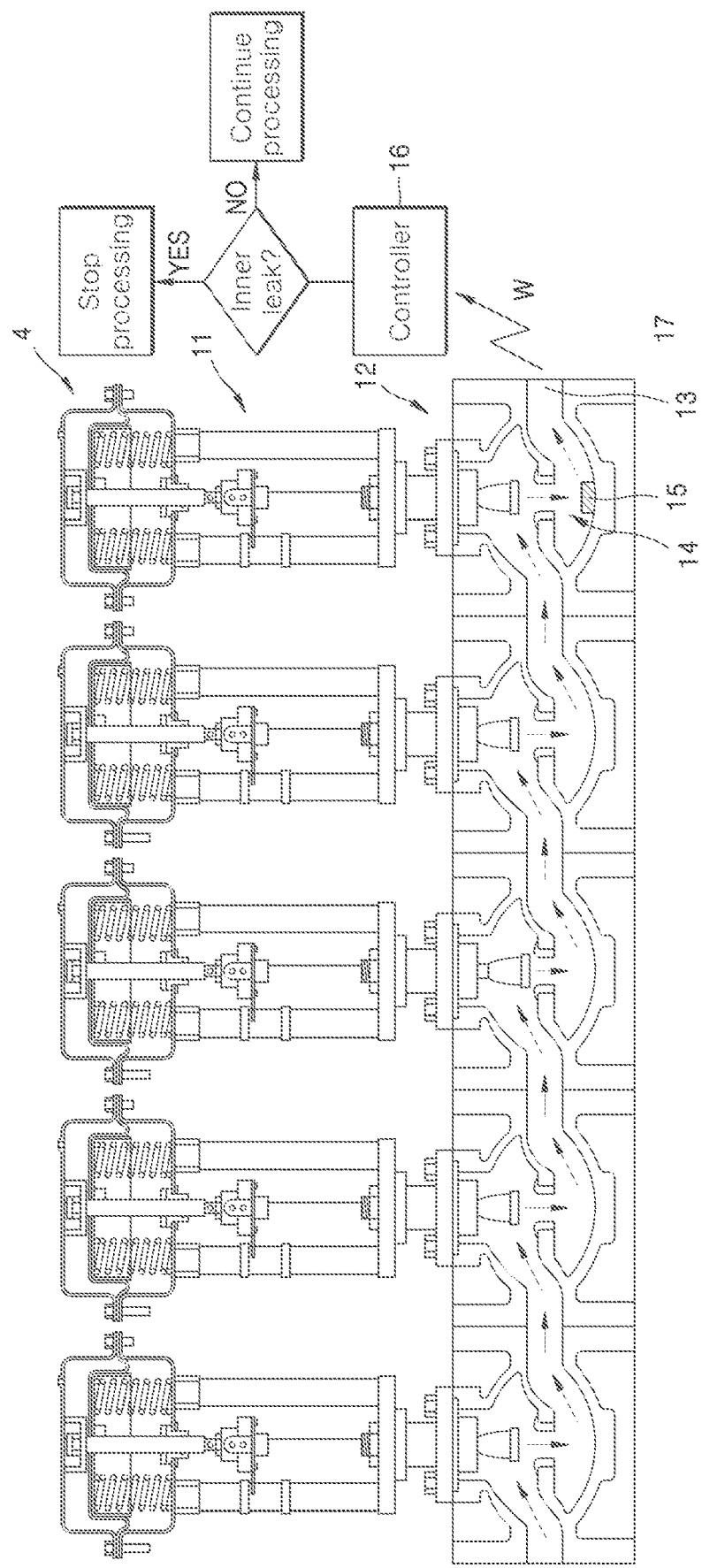

FIGS. 11 and 12 are views of a gas supply unit and a method of diagnosing an inner leak according to the disclosure.

In FIG. 11, one end of the block portion 12 of the gas supply unit 4, specifically, one end of the gas flow path 13 in the block portion 12 is connected to a detection unit 15. In FIG. 11, a gas inlet path 17 connects the block portion 12 to the detection unit 15, and gas in the gas flow path 13 flows into the detection unit 15 through the gas inlet path 17. A controller 16 diagnoses whether or not gas is leaked in the gas flow path 13 in the gas supply unit 4 through a signal detected by the detection unit 15 and determines whether to operate the substrate processing device 1 (of FIG. 7). For example, when an inner leak occurs, the substrate processing is controlled to be stopped, and when an inner leak does not occur, the substrate processing is controlled to continue. The detection unit 15 may be, for example, an optical sensor. However, the detection unit 15 is not limited thereto, and may be another device for detecting gas. For example, in another embodiment, the detection unit 15 may be a spectrum analysis device. In this case, the detection unit 15 may analyze the spectrum of gas to diagnose gas components in addition to the leakage of gas, thereby more accurately diagnosing an inner leak portion of the gas supply unit 4.

As an additional and exemplary embodiment, FIG. 12 shows a state in which the detection unit 15 is mounted on the gas inlet path 14. For example, the detection unit 15 may be a portion of the block unit 12. In this case, the detection unit 15 mounted on the gas inlet path 14 may detect information such as the presence or absence of gas in the gas flow path 13, the type of gas, and/or the flow rate of gas. The detection unit 15 may generate a wireless signal based on the information and transmit a wireless signal W to the controller 16 of the substrate processing device.

Figure 13:
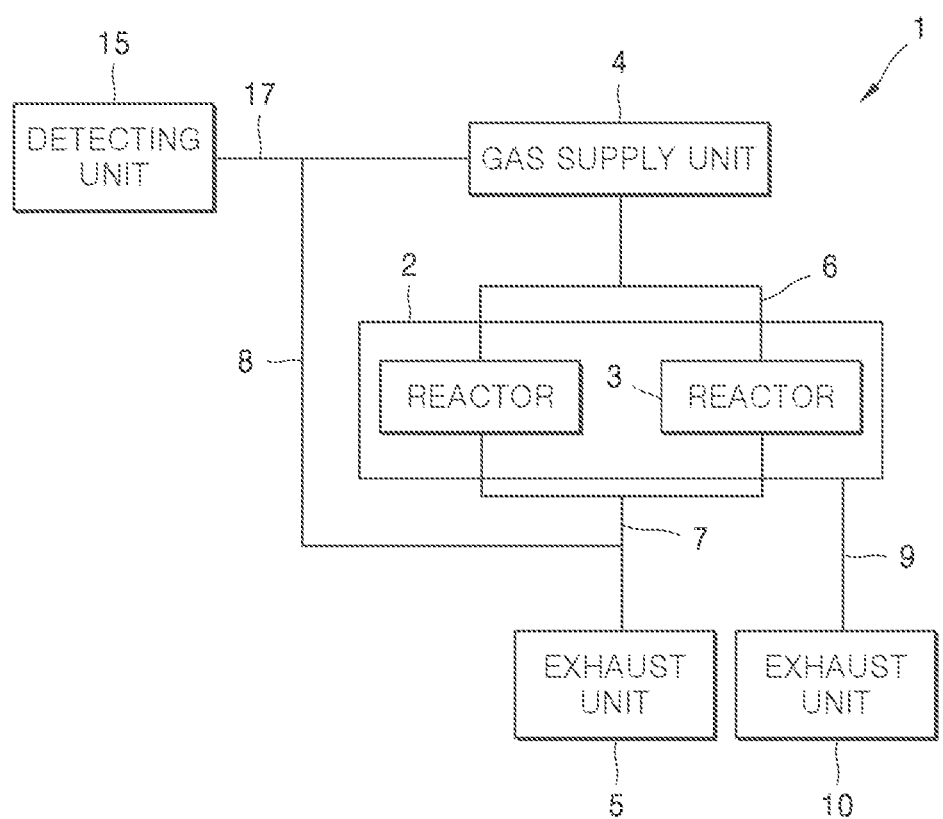
FIG. 13 is a view of a substrate processing device in which a detection unit according to FIGS. 11 and 12 is installed.

FIG. 13 is a view of the substrate processing device 1 in which the detection unit 15 according to FIGS. 11 and 12 is installed.

In FIG. 13, the detection unit 15 may be installed on one side of the diversion path 8 of the gas supply unit 4 and is connected to the diversion path 8 through the gas inlet path 17. The detection unit 15 and the gas supply unit 4 may be configured separately and may be connected to each other through the gas inlet path 17. However, in another embodiment, the detection unit 15 and the gas inlet path 17 may be a portion of the gas supply unit 4. For example, the gas inlet path 17 may be a block portion of the gas supply unit 4, and the detection portion 15 may be mounted on the gas inlet path 14 (see FIG. 12).

Figure 14:
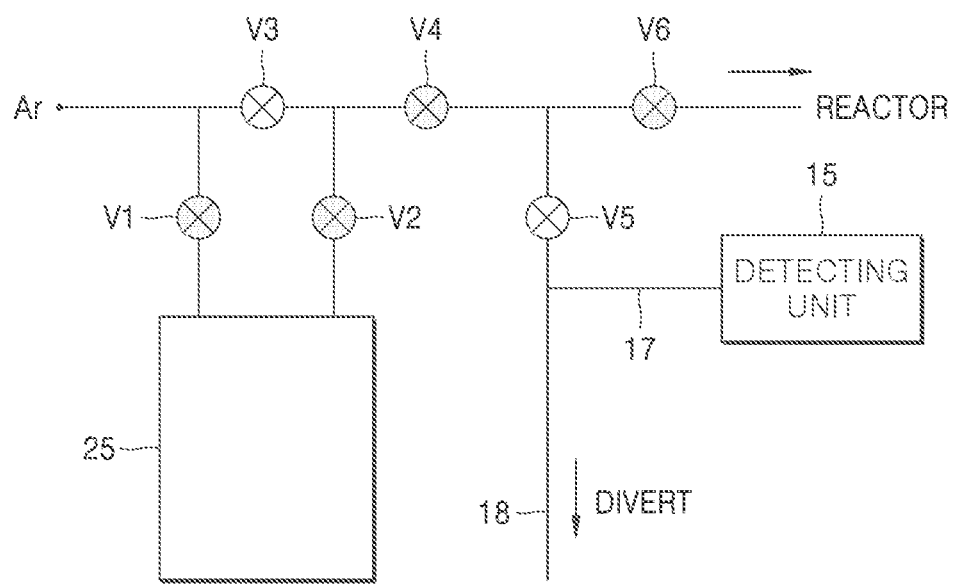
FIG. 14 is a view of an example embodiment showing in more detail a state in which a detection unit is connected to a diversion path in a substrate processing device.

In the substrate processing device of FIG. 13, the detection unit 15 is connected to the diversion path 8. FIG. 14 shows a more specific embodiment.

FIG. 14 shows a portion where the gas supply unit 4 (FIG. 13) is connected to a source container 25. In FIG. 14, the detection unit 15 is mounted on a source diversion line. In FIG. 14, when the carrier gas inlet valve V1, the source outlet valve V2, a source supply valve V4, and a reactor valve V6 are closed, the source purge valve V3 and the source diversion valve V5 are opened, and Ar gas is supplied, the detection unit 15 may determine whether the source supply valve V4 is abnormal. In other words, the detection unit 15 may determine whether the source supply valve V4 is abnormal by filling a gas supply path to the front end of the source supply valve V4 with Ar gas and performing a pressurized check on the source supply valve V4.

In another embodiment, by performing a pressurization check on the source purge valve V3 by closing the source purge valve V3, opening the source supply valve V4 and filling the gas supply path with Ar gas, the detection unit 15 may determine whether the source purge valve V3 is abnormal. The source supply valve V4 and the source purge valve V3 are important components for controlling source supply, and when there is a problem with the valves, it may cause a reliability issue of a device, a decrease in reproducibility of a substrate process and a device failure. Therefore, with a diagnostic method according to the disclosure, it is possible to determine whether the valves are defective and whether there is an inner leak due to them. FIG. 14 illustrates a source supply unit according to an embodiment. According to an embodiment, a detection unit may be installed in a reactive gas path, other gas supply path, or a diversion path, and thus, it is possible to determine whether a valve on the gas supply path or a gas supply control device is defective or leaks.

Figure 15:
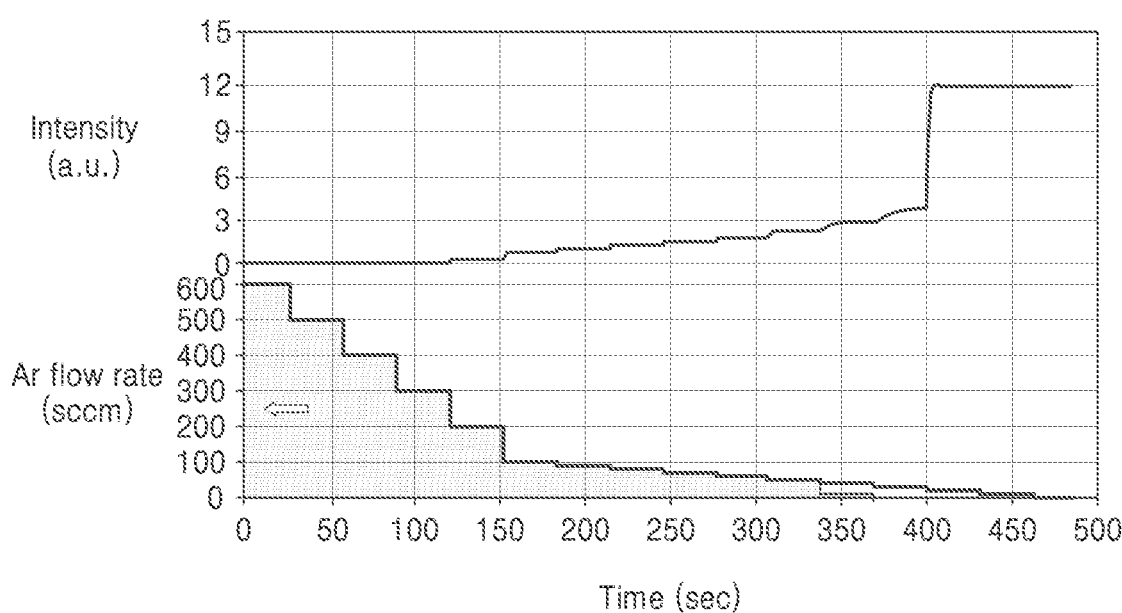
FIG. 15 is a graph showing a signal corresponding to a leaked Ar gas detected by an actual detection unit.

FIG. 15 is a graph showing a signal corresponding to a leaked Ar gas detected by an actual detection unit.

The detection unit of FIG. 15 uses an optical sensor. When a valve to be checked is closed and an Ar pressure check is performed, the Ar flow is initially high due to the gas remaining in a gas supply path at the rear end of the valve, but as time passed, all of the Ar flow is exhausted through a divert path. After that, Ar gas is filled in the front end of the valve and the leakage of the valve is evaluated. In FIG. 15, microleakage is found in the interval after 400 seconds, and the intensity of a diagnostic signal is rapidly increased accordingly. Therefore, in this way, it is possible to determine whether there is microleakage. In the example of FIG. 15, a detection unit more optimized for microleakage is used, and the detection sensitivity is stronger when a fine amount of Ar gas flows than when a large amount of Ar gas flows.

A diagnostic method according to the disclosure may be performed in an idle between one batch (e.g., 25 wafers) process and the next batch process, or may be performed during the period until the process of one substrate is completed and the next substrate is carried into a reactor within the same batch process, so that productivity and device operating efficiency may be maintained.

Previously, helium is used to diagnose, but a helium diagnosis device is large and expensive, and by injecting helium gas from the outside of a gas supply unit toward the gas supply unit, the accuracy is low and inefficient in determining a defective area. In addition, in the case of using the helium diagnostic device, there is a limitation in that operating efficiency is low because the operation of a substrate processing device needs to be temporarily suspended. However, the diagnostic method according to the disclosure is simpler and cheaper, has high diagnostic accuracy for an inner leak, and may minimize a decrease in operating efficiency of the substrate processing device by proceeding the operation of the substrate processing device without stopping it.

It is to be understood that the shape of each portion of the accompanying drawings is illustrative for a clear understanding of the disclosure. It should be noted that the portions may be modified into various shapes other than the shapes shown.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing device comprising:
   at least one reactor;
   a gas supply unit configured to supply a gas to the reactor; and
   a detection unit connected to the gas supply unit,
   wherein the detection unit is configured to detect a gas flow in the gas supply unit,
   wherein the gas supply unit comprises:
      a gas container;
      an intermediate path connected to the gas container, the detection unit, and the reactor; and
      a gas container valve connected between the gas container and the intermediate path,
   wherein the substrate processing device further comprises:
      a detection unit valve connected between the detection unit and the intermediate path; and
      a reactor valve connected between the reactor and the intermediate path, and
      wherein the detection unit is configured to detect the gas flow in a state in which the gas container valve is closed, the detection unit valve is opened, and the reactor valve is closed.

2. The substrate processing device of claim 1, wherein the gas supply unit comprises:
   a valve unit;
   a diaphragm connected to the valve unit; and
   a gas flow path configured to be opened and closed by the diaphragm.

3. The substrate processing device of claim 2, wherein the detection unit is connected to one end of the gas flow path.

4. The substrate processing device of claim 2, wherein the detection unit is mounted on the gas flow path of the gas supply unit.

5. The substrate processing device of claim 1, wherein the detection unit is installed outside the gas supply unit, and
   the substrate processing device further comprises a detection unit valve arranged between the detection unit and the gas supply unit.

6. The substrate processing device of claim 1, wherein the detection unit comprises an optical sensor configured to detect the gas flow.

7. The substrate processing device of claim 1, wherein the detection unit comprises a spectrum analysis device configured to diagnose the gas flow and gas components.

8. The substrate processing device of claim 1, wherein the detection unit is configured to perform a first detection operation on the gas container valve.

9. The substrate processing device of claim 8, further comprising:
   a diversion path connected between the detection unit and the detection unit valve, and
   gas remaining in the intermediate path is exhausted through the diversion path during the first detection operation of the detection unit.

10. The substrate processing device of claim 8, wherein the first detection operation is performed during a processing operation of the substrate processing device.

11. The substrate processing device of claim 10, wherein the first detection operation is performed during a pause between a first batch process and a second batch process.

12. The substrate processing device of claim 10, wherein the first detection operation is performed during a period of time until a second substrate is carried into the reactor after the process for a first substrate is completed within the same batch process.

13. A substrate processing device comprising:
    at least one reactor;
    a gas supply unit configured to supply a gas to the reactor; and
    a detection unit connected to the gas supply unit,
    wherein the detection unit is configured to detect a gas flow in the gas supply unit,
    wherein the gas supply unit comprises:
       a gas container;
       an intermediate path connected to the gas container, the detection unit, and the reactor; and
       a gas container valve connected between the gas container and the intermediate path,
       a first path;
       a first valve connected between the first path and the gas container;
       a second valve configured to discharge the gas from the gas container to a second path; and
       a third valve connected between the first path and the second path,
       wherein the gas container valve is connected between the second path and the intermediate path, and
       wherein the substrate processing device further comprises:
          a detection unit valve connected between the detection unit and the intermediate path; and a reactor valve connected between the reactor and the intermediate path.

14. The substrate processing device of claim 13, wherein the detection unit is configured to perform a second detection operation on the third valve.

15. The substrate processing device of claim 14, wherein the detection unit is configured to detect the gas flow in a state in which the first valve, the second valve, and the third valve are closed, the gas container valve and the detection unit valve are opened, and the reactor valve is closed.

16. A substrate processing device comprising:
a gas container configured to store a first gas;
a first path configured to deliver a second gas;
a second path configured to deliver at least one of the first gas and the second gas;
a first valve connected between the first path and the gas container;
a second valve configured to discharge the first gas from the gas container to the second path;
a third valve connected between the first path and the second path;
a third path connected to the second path and configured to deliver the first gas and the second gas;
a fourth valve connected between the second path and the third path;
a fifth valve connected between the third path and a detection unit; and
a sixth valve connected between the third path and a reactor,
wherein the detection unit is configured to detect a gas leakage in at least one of the first valve, the second valve, the third valve, and the fourth valve.

* * * * *